United States Patent
Shibata et al.

(10) Patent No.: US 7,282,725 B2
(45) Date of Patent: *Oct. 16, 2007

(54) METHOD OF MANUFACTURING SEMICONDUCTOR DEVICE, SEMICONDUCTOR MANUFACTURING APPARATUS, AND STENCIL MASK

(75) Inventors: Takeshi Shibata, Tsukuba (JP); Hisanori Misawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 11/284,035

(22) Filed: Nov. 22, 2005

(65) Prior Publication Data
US 2006/0071183 A1    Apr. 6, 2006

Related U.S. Application Data (62) Division of application No. 10/738,038, filed on Dec. 18, 2003, now Pat. No. 7,034,318.

(30) Foreign Application Priority Data
Dec. 26, 2002    (JP) .............................. 2002-376213

(51) Int. Cl.
*H01J 37/08*    (2006.01)
(52) U.S. Cl. ........................... 250/492.21; 250/492.23; 250/492.2; 250/396 R
(58) Field of Classification Search ............ 250/492.21
See application file for complete search history.

(56) References Cited

U.S. PATENT DOCUMENTS 4,524,278 A * 6/1985 Le Poole .................... 250/398
4,560,878 A * 12/1985 Knauer et al. .......... 250/396 R
5,838,058 A * 11/1998 Kitajima et al. ............ 257/628
6,214,498 B1 * 4/2001 Choi ............................. 430/5
2002/0058400 A1    5/2002 Suguro et al.

FOREIGN PATENT DOCUMENTS

| JP | 49-68660 | 7/1974 |
|---|---|---|
| JP | 2002-203806 | 7/2002 |
| JP | 2002-237447 | 8/2002 |
| WO | WO 02/052662 A1 | 7/2002 |

* cited by examiner

*Primary Examiner*—Robert Kim
*Assistant Examiner*—Phillip A. Johnston
(74) *Attorney, Agent, or Firm*—Finnegan, Henderson, Farabow, Garrett & Dunner, L.L.P.

(57) ABSTRACT

A manufacturing apparatus of a semiconductor device is disclosed, which comprises an implantation source which applies particles or an electromagnetic wave into an implantation region of a semiconductor substrate in a θ direction shifted by an angle θ from a vertical direction of the semiconductor substrate, a first stencil mask disposed between the semiconductor substrate and the implantation source, the first stencil mask having a first opening corresponding in the θ direction to the implantation region, and a second stencil mask disposed between the first stencil mask and the implantation source, the second stencil mask having a second opening corresponding in the θ direction to the implantation region.

4 Claims, 7 Drawing Sheets

METHOD OF MANUFACTURING SEMICONDUCTOR DEVICE, SEMICONDUCTOR MANUFACTURING APPARATUS, AND STENCIL MASK

CROSS-REFERENCE TO RELATED APPLICATIONS

This application is a division of application Ser. No. 10/738,038, filed Dec. 18, 2003, now U.S. Pat. No. 7,034,318 and is based up on and claims priority from Japanese Patent Application No. 2002-376213, filed Dec. 26, 2002, the entire contents of both of which are incorporated herein by reference.

BACKGROUND OF THE INVENTION

1. Field of the Invention

The present invention relates to a stencil mask for use in semiconductor manufacturing process, a semiconductor device, and a method of manufacturing the semiconductor device using the stencil mask.

2. Description of the Related Art

In a conventional method of manufacturing a semiconductor device, in a process of fabricating MOSFETs (metal oxide semiconductor field effect transistor) of different channel types or MOSFETs of different threshold voltages in a semiconductor substrate, a stencil mask having an opening is provided above a semiconductor substrate spaced apart at a certain distance when impurity ions are implanted into a well region, a channel region, etc.

Such a stencil mask is used in other cases, for example, when particles (charged particles such as electrons or ions, neutral particles such as atoms, molecules, neutrons, etc.) or electromagnetic waves (optical light, X-ray, etc.) are implanted into a substrate.

A stencil mask for use in a semiconductor manufacturing method is generally formed from an SOI (silicon on insulator) substrate through manufacturing steps shown in FIGS. 10 to 13.

A method of manufacturing a stencil mask will be explained below by referring to FIGS. 10 to 13.

Figure 10:
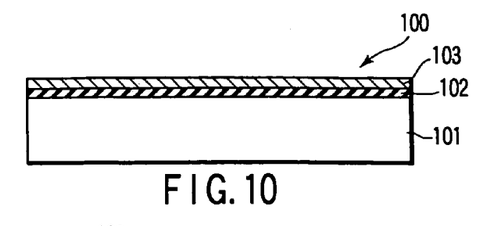
FIG. 10 is a cross sectional view of a stencil mask, for explaining a step of a conventional method of manufacturing a stencil mask.

FIG. 10 shows an ordinary SOI substrate 100. The SOI substrate 100 is provided by implanting oxygen into a silicon substrate 101 and then annealed at a high temperature to thereby form a silicon oxide film 102 having a depth of tens to hundreds of nm from the surface of the silicon substrate 101. After that, a thin silicon film 103 is formed on the silicon oxide film 102.

Figure 11:
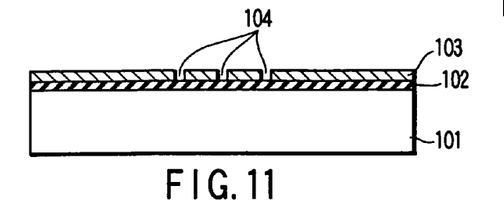
FIG. 11 is a cross sectional view of the stencil mask, for explaining a step following the step of FIG. 10 of the conventional method of manufacturing a stencil mask.

Next, as shown in FIG. 11, resist (not shown) is coated on the top surface of the thin silicon film 103, and a resist pattern (not shown) is formed by lithography. Then, the thin silicon film 103 is anisotropically etched by using the resist pattern as a mask to form an opening 104 in the thin silicon film 103. After forming the opening 104 in the thin silicon film 103, the resist pattern is no longer necessary and is removed.

Figure 12:
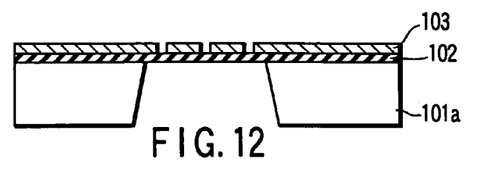
FIG. 12 is a cross sectional view of the stencil mask, for explaining a step following the step of FIG. 11 of the conventional method of manufacturing a stencil mask.

As shown in FIG. 12, resist (not shown) is coated on the back surface of the silicon substrate 101, and a resist pattern (not shown) is formed by lithography. Subsequently, the silicon substrate 101 is treated in a chemical solution of KOH or the like, so that a portion of the silicon substrate 101 the resist coated on which was removed by the lithography is removed, leaving only the remaining portion of the silicon substrate 101 on which the resist pattern is provided. The silicon substrate portion thus left forms a supporting portion 101a. The resist pattern is then no longer necessary and is removed.

Figures 13, 14:
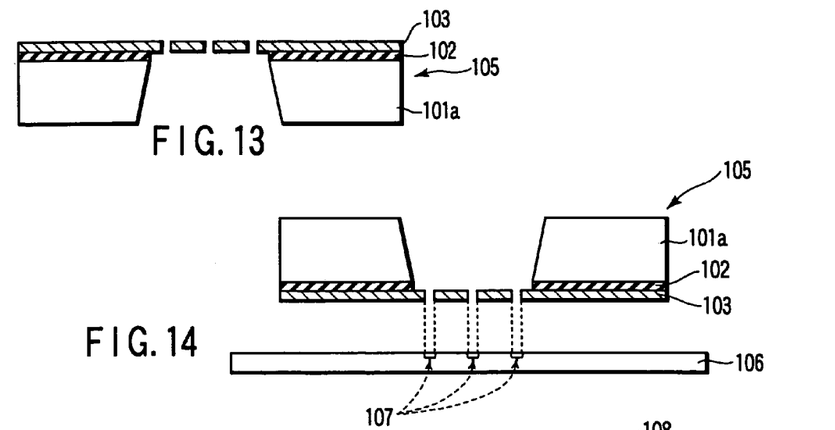
FIG. 13 is a cross sectional view of the stencil mask, for explaining a step following the step of FIG. 12 of the conventional method of manufacturing a stencil mask.
FIG. 14 is a cross sectional view of a stencil mask and a semiconductor substrate in conventional art, and shows the positional relation of the stencil mask and the semiconductor substrate.

Subsequently, as shown in FIG. 13, by treating with a chemical solution such as hydrofluoric acid, the silicon oxide film 102 exposed by the step in FIG. 12, from the back surface thereof, the exposed portion of the silicon oxide film 102 is removed. In this way, a stencil mask 105 having the opening 104 formed therein is formed.

In a manufacturing method of a semiconductor device, the stencil mask 105 having the opening 104 is used when impurity ions are implanted into a semiconductor substrate.

As shown in FIG. 14, the stencil mask 105 is placed above a semiconductor substrate 106 so that the opening 104 of the stencil mask 105 aligns with an ion implantation region 107 of the semiconductor substrate 106.

Figure 15:
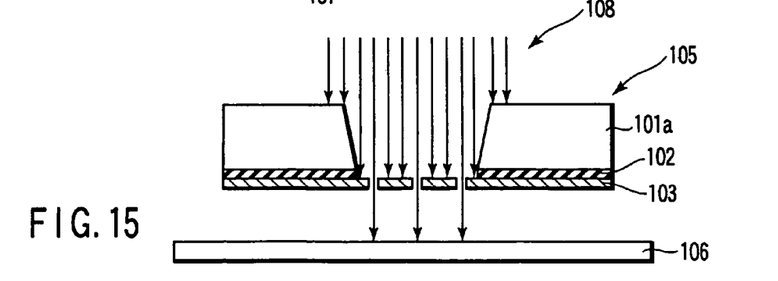
FIG. 15 is a cross sectional view of the stencil mask and the semiconductor substrate shown in FIG. 14, and shows the positional relation of the stencil mask and the semiconductor substrate, in which implantation of impurity ions is shown.

Then, as shown in FIG. 15, impurity ions are implanted into the ion implantation region of the semiconductor substrate 106 through the opening 104 of the stencil mask 105 from above the stencil mask 105. On the other hand, impurity ions are not implanted into other region of the semiconductor substrate 106 than the implantation region thereof, since the other-region is masked with the stencil mask 105.

Generally, the stencil mask 105 is repeatedly used, and impurity ion implantation is repeatedly carried out. When the ion implantation is repeated, impurity ions blocked by the stencil mask 105 are accumulated on the stencil mask 105. Further, damages are accumulated on the stencil mask 105 due to the blocking of the impurity ions. Further, the stencil mask may be loaded and deformed by gravity, inertia of conveying and moving the stencil mask 105, and the like (for example, see Jpn. Pat. Appln. KOKAI Publication No. 2002-203806).

The flexible strength of a thin film depends on physical properties represented by Young's modulus of the film, the thickness of the film and the area of the thin film region. Generally, the strength of the film is in proportion to third power of a thickness of the film. Thus, the strength of the stencil mask 105 can be high by increasing the film thickness of the stencil mask 105, so that the stencil mask 105 is prevented from being deformed.

On the other hand, as described, the opening 104 of the stencil mask 105 is formed by carrying out an anisotropic etching of an SOI substrate. Accordingly, the forming process of the opening of the stencil mask 105 depends on the material and thickness of the film to be processed. Generally, the forming process of an opening depends on a ratio (i.e., aspect ratio) of the size of the opening to be formed and the depth of the opening. It is difficult to finely process a film when the film is thick, whereas it is possible to finely process a film when the film is thin. Thus, if the film thickness of the stencil mask 105 is increased in order to enhance the strength, it becomes difficult to make a fine processing of the opening 104.

In a manufacturing method of a semiconductor device, a stencil mask is used in a step of an oblique ion implantation or a lens projection reduction aligning. In this case, ion particles are applied obliquely to the stencil mask disposed in parallel to a semiconductor substrate.

Figure 16:
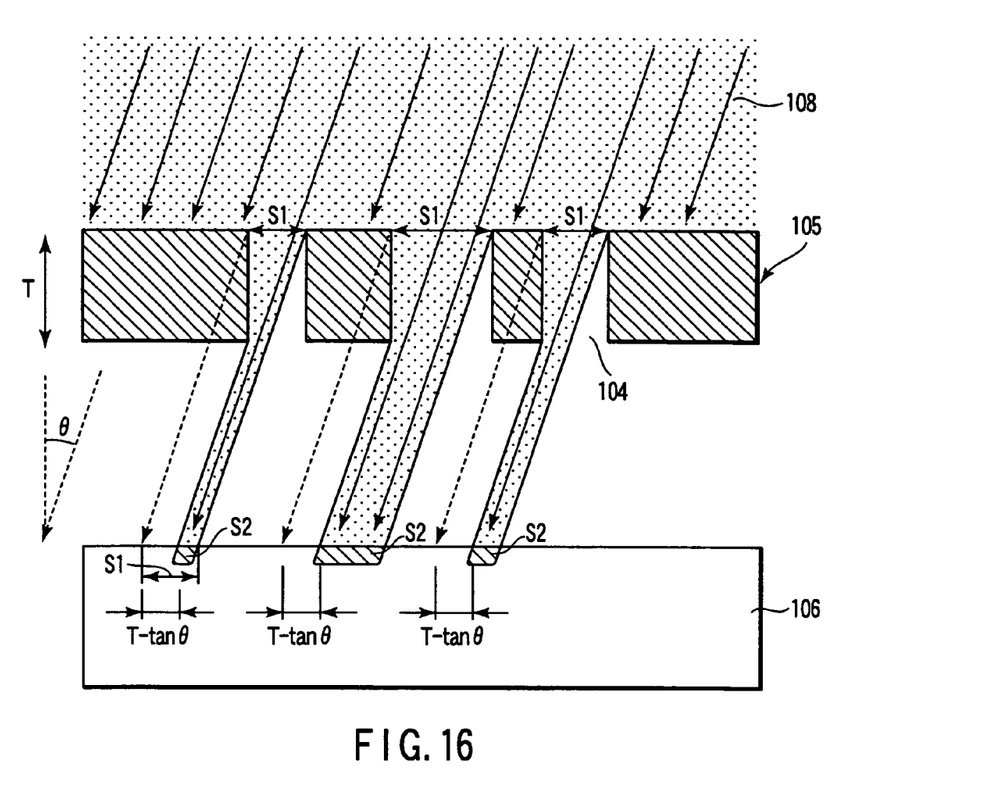
FIG. 16 is a cross sectional view of a stencil mask and a semiconductor substrate in conventional art, and shows the positional relation of the stencil mask and the semiconductor substrate, in which implantation of impurity ions in an oblique direction is shown.

When the stencil mask 105 processed vertically to the surface thereof by anisotropic etching, as shown in FIG. 16, is used, there arises a problem that part or all of the particles passing through the opening 104 are blocked by the side wall of the opening of the stencil mask 105 and are not implanted into the semiconductor substrate 106. This problem is called shadowing.

Disadvantages of the shadowing will be explained by referring to FIG. 16. Assume that charged particles are applied at an angle θ to the stencil mask which is set above the substrate and defines the particle implantation region of the substrate. Also, assuming that the film thickness of the stencil mask is T, the width of the opening of the stencil mask and the width of the particle implantation region of the substrate in which particle are to be implanted is S1, and the width of a region of the substrate in which the particles are actually implanted is S2. Then, the relation of S2=S1−T·tan θ is established. The width S2 is smaller than the width S1 by a part corresponding to T·tan θ. T·tan θ becomes large as the angle θ becomes larger. Also, T·tan θ becomes large as the film thickness of the stencil mask larger. In other words, the rate of blocking of the particles due to shadowing is increased, as the film thickness of the stencil mask is more increased to enhance the strength. Accordingly, the particle implantation region becomes small.

BRIEF SUMMARY OF THE INVENTION

According to an aspect of the present invention, there is provided a manufacturing apparatus of a semiconductor device, comprising:

an implantation source which implants particles or an electromagnetic wave into an implantation region of a semiconductor substrate in a θ direction shifted by an angle θ from a vertical direction of the semiconductor substrate;

a first stencil mask disposed between the semiconductor substrate and the implantation source, the first stencil mask having a first opening corresponding in the θ direction to the implantation region; and, a second stencil mask disposed between the first stencil mask and the implantation source, the second stencil mask having a second opening corresponding in the θ direction to the implantation region.

According to another aspect of the present invention, there is provided a manufacturing apparatus of a semiconductor device, comprising:

an implantation source which applies particles or an electromagnetic wave into an implantation region of a semiconductor substrate in a θ direction shifted by an angle θ from a vertical direction of the semiconductor substrate;

a first stencil mask disposed between the semiconductor substrate and the implantation source, the first stencil mask having a first opening corresponding in the θ direction to the implantation region;

a second stencil mask disposed between the first stencil mask and the implantation source, the second stencil mask having a second opening corresponding in the θ direction to the implantation region; and a position adjusting device which relatively moves the first stencil and the second stencil to position the first stencil so that the first opening of the first stencil is set in a θ direction shifted by an angle θ from a vertical direction of the particle implantation region of the semiconductor substrate and position the second stencil so that the second opening of the second stencil is set in the θ direction shifted by the angle θ from the vertical direction of the particle implantation region of the semiconductor substrate.

According to a further aspect of the present invention, there is provided a manufacturing apparatus of a semiconductor device in which particles generated by a particle generating device are implanted into an implantation region of a semiconductor substrate by way of a stencil mask structure having an opening for allowing the particles to pass therethrough, wherein the stencil mask structure comprises a first stencil mask disposed between the semiconductor substrate and the particle generating device, the first stencil mask having a first opening corresponding to the particle implantation region, and a second stencil mask disposed between the first stencil mask and the particle generating device, the second stencil mask having a second opening corresponding to the implantation region.

According to a further aspect of the present invention, there is provided a manufacturing apparatus of a semiconductor device in which particles generated by a particle generating device are implanted into an implantation region of a semiconductor substrate by way of a stencil mask structure having an opening for allowing the particles to pass therethrough, wherein the stencil mask structure comprises a first stencil mask disposed between the semiconductor substrate and the particle generating device, the first stencil mask having a first opening corresponding to the particle implantation region, and a second stencil mask disposed between the first stencil mask and the particle generating device, the second stencil mask having a second opening corresponding to the implantation region; and the manufacturing apparatus further comprises a position adjusting device which relatively moves the first stencil and the second stencil to position the first stencil so that the first opening of the first stencil is set in a θ direction shifted by an angle θ from a vertical direction of the particle implantation region of the semiconductor substrate and position the second stencil so that the second opening of the second stencil is set in the θ direction shifted by the angle θ from the vertical direction of the particle implantation region of the semiconductor substrate.

According to a further aspect of the present invention, there is provided a method of manufacturing a semiconductor device, comprising:

generating particles to be implanted into a semiconductor substrate;

causing the particles to pass through a second opening of a second stencil mask having the second opening formed therein;

causing the particles having passed through the second opening to pass a first opening of a first stencil mask having the first opening formed therein; and applying the particles having passed through the first opening of the first stencil into an implantation region of the semiconductor substrate.

According to a further aspect of the present invention, there is provided a method of manufacturing a semiconductor device, comprising:

generating particles to be implanted into a semiconductor substrate;

causing the particles to pass through a second opening of a second stencil mask having the second opening formed therein;

causing the particles having passed through the second opening to pass a first opening of a first stencil mask having the first opening formed therein; and applying the particles having passed through the first opening of the first stencil into an implantation region of the semiconductor substrate, and wherein the first opening of the first stencil has a rectangle shape having a first width in a first direction, and the second opening of the second stencil has a rectangle shape having a second width in a second direction orthogonal to the first direction, and the implantation region has a square having one side of a length corresponding to the first width of the rectangle shape of the first opening and another side of a length adjacent to the first side corresponding to the second width of the rectangle shape of the second opening.

According to a further aspect of the present invention, there is provided a stencil mask comprising:

a first transfer mask;

a second transfer mask spaced from one side of the first transfer mask by a predetermined distance; and a fixing device which fixes the first transfer mask and the second transfer mask.

DETAILED DESCRIPTION OF THE INVENTION

Embodiments of the present invention will be described below while referring to the accompanying drawings.

First Embodiment

Figure 1:
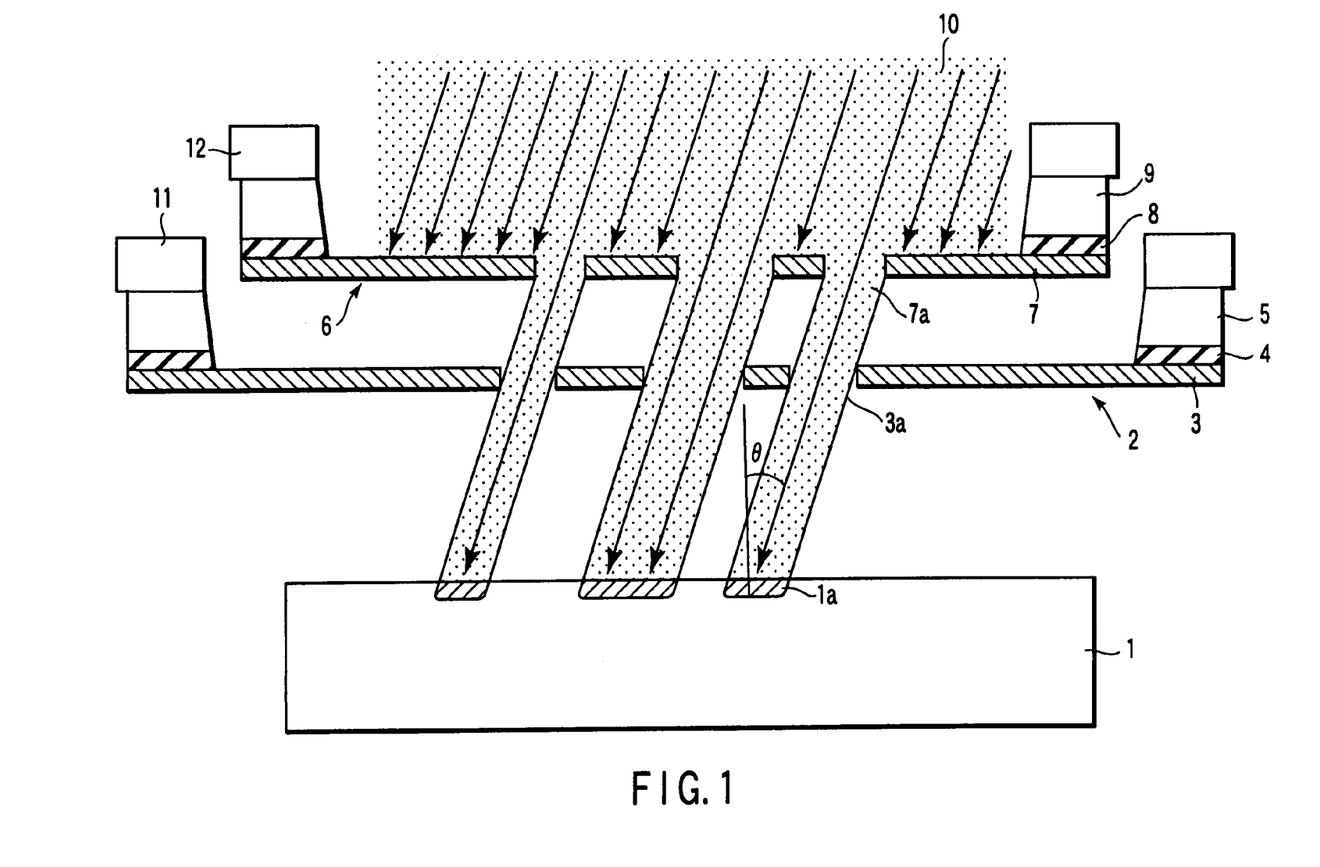
FIG. 1 is a cross sectional view of a part of an ion implantation device of a semiconductor device manufacturing apparatus according to a first embodiment of the present invention.

FIG. 1 shows a positional relation between stencil masks 2, 6 and a semiconductor substrate 1 of a semiconductor device manufacturing apparatus according to a first embodiment of the present invention.

The first stencil mask 2 is set above the semiconductor substrate 1 at a distance from the semiconductor substrate 1. Also, the second stencil mask 6 is set above the first stencil mask 2 at a distance from the first stencil mask 2.

The first and second stencil masks 2, 6 have first and second thin silicon films 3, 7, respectively. The first and second thin silicon films 3, 7 have first and second openings 3a, 7a formed therein, respectively, for allowing impurity ions 10 to pass therethrough. Also, the first and second stencil masks 2, 6 have first and second support portions 5, 9 made of silicon. The first and second support portions 5, 9 support the first and second thin silicon films 3, 7, respectively. A first silicon oxide film (insulating film) 4 is formed between the first thin silicon film 3 and the first support portion 5. A second silicon oxide film (insulating film) 8 is formed between the second thin silicon film 7 and the second support portion 9.

The film thickness of the first and second thin silicon films 3, 7 is smaller than the film thickness of the conventional stencil mask. The first and second openings 3a, 7a formed in the first and second thin silicon films 3, 7 have the same pattern.

Electrostatic chucks 11, 12 chuck the first and second support portions 5,9, respectively, to fix the first and second stencil masks 2, 6, respectively, at predetermined portions of the ion implanting device.

Figure 2:
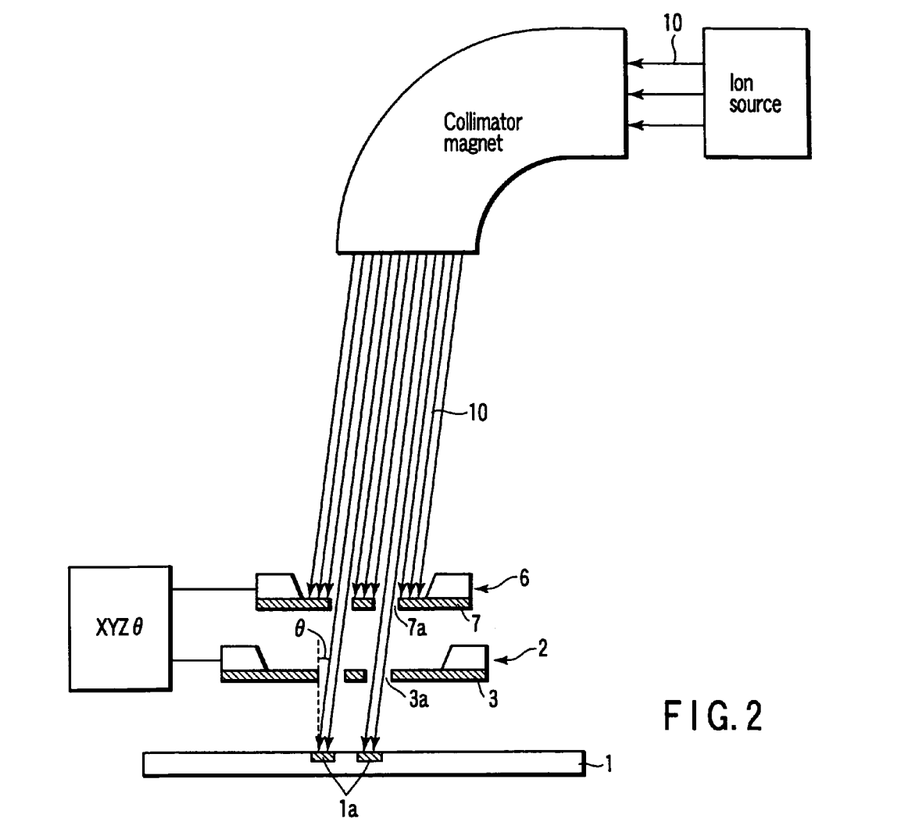
FIG. 2 is a cross sectional view of the part of the ion implantation device of the semiconductor device manufacturing apparatus according to the first embodiment of the present invention, in which an implantation source and collimator are further shown.

FIG. 2 shows an ion implantation process using the first and second stencil masks 2, 6. In FIG. 2, the positional relation between the semiconductor substrate 1 and the first and second stencil masks 2, 6 is the same as shown in FIG. 1.

The first and second stencil masks 2, 6 are relatively moved by, for example, an XYZθ stage, in accordance with the ion incident angle θ of the impurity ions, to adjust the positional relation between the first and second openings 3a and 7a of the first and second stencil masks 2, 6 and an impurity ion implantation region of the semiconductor substrate 1.

The relative positioning of the first stencil mask 2 and the second stencil mask 6 can be checked with, for example, an optical device (not shown). That is, to this end, an alignment opening (not shown) is formed in the second stencil mask 6, and an alignment pattern (not shown) is formed on the first stencil mask 2. The alignment pattern of the first stencil mask 2 is monitored in the θ direction using the optical device through the alignment opening of the second stencil mask 6 from above the second stencil mask 6, while the first stencil mask 2 and second stencil mask 6 are relatively moved by the XYZθ stage.

Similarly, the relative positioning of the first and second stencil masks 2, 6 and the semiconductor substrate 1 can be checked with the optical device. That is, to this end, first and second alignment openings (not shown) are formed in the first and second stencil masks 2, 6, and an alignment pattern (not shown) is formed in the semiconductor substrate 1. The alignment pattern of the semiconductor substrate 1 is monitored in the θ direction using the optical device through the second alignment opening and first alignment opening from above the second stencil mask 6, while the first stencil mask 2 and second stencil mask 6 are relatively moved by the XYZθ stage.

After the semiconductor substrate 1 and first and second stencil masks 2 and 6 have been positioned, the impurity ions 10 are applied from an ion source through a collimator magnet to the second stencil mask 6 at an incident angle θ.

The impurity ions applied to the opening 7a of the second stencil mask 6 pass through the opening 7a, while the impurity ions applied to the portion other than the opening 7a of the second stencil mask 6 are blocked by the second stencil mask 6. The impurity ions 10 having passed through the second opening 7a pass through then the first opening 3a of the first stencil mask 2 at the incident angle θ to the first stencil mask 2. The impurity ions 10 having passed through the first opening 3a of the first stencil mask 2 are implanted in the impurity ion implantation region 1a of the semiconductor substrate 1.

The openings 3a, 7a of the first stencil mask 2 and second stencil mask 6 have the same pattern, and the first stencil mask 2 and second stencil mask 6 are relatively positioned so as to conform to the incident angle θ. Thus, the impurity ions 10 having passed through the second opening 7a are hardly blocked by the first stencil mask 2, and thus reach the impurity ion implantation region 1a of the semiconductor substrate 1, while maintaining the shape of the second opening 7a.

Since the first and second thin silicon films 3, 7 are thin, the shadowing occurred when the impurity ions 10 pass through the stencil masks can be greatly reduced.

The fact that the first and second thin silicon films 3, 7 are thin is advantageous for suppressing the shadowing, however, the strength of the stencil masks is lowered. However, since the impurity ions applied to the portion other than the opening 7a of the second stencil mask 6 have been blocked with the second stencil mask 6, the amount of impurity ions 10 to be blocked by the first stencil mask 2 is small. Thus, the first stencil mask 2 is hardly deteriorated by the impurity ions 10.

Figure 3:
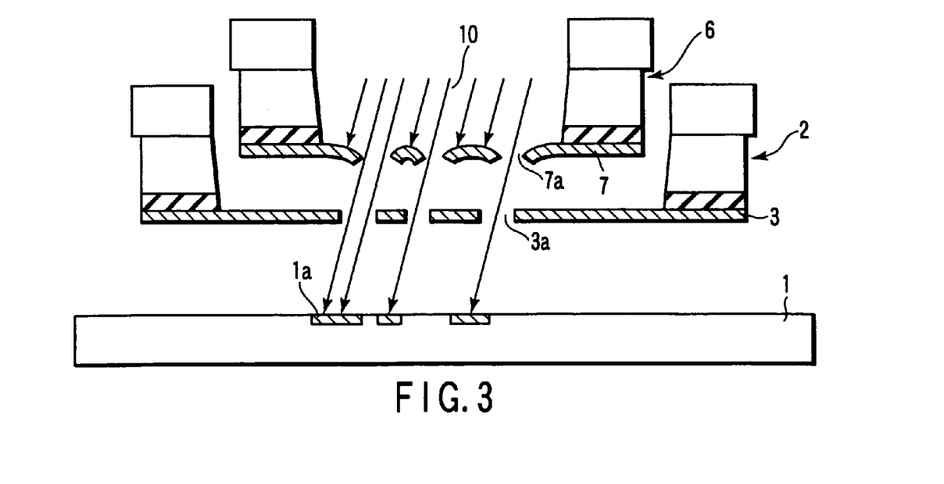
FIG. 3 is a cross sectional view of the part of the ion implantation device of the semiconductor device manufacturing apparatus according to the first embodiment of the present invention, in which implantation of impurity ions is shown.

As shown in FIG. 3, the second stencil mask 6 is deteriorated and deformed due to the impingement of impurity ions 10 onto the second stencil mask 6, and the second opening 7a of the second thin silicon film 7 is changed in shape, so that the second opening 7a is changed from the predetermined opening pattern.

However, the impurity ion implantation region 1a of the semiconductor substrate 1 is ultimately defined by the first opening 3a of the first stencil mask 2, that is, an opening of a stencil mask through which the impurity ions 10 pass immediately before they reach the semiconductor substrate 1. Accordingly, even if the second stencil mask 6 is deformed by the impingement of the impurity ions 10, the pattern of the impurity ion implantation region 1a can be maintained with the first stencil mask 2.

The impurity ions 10 passing through the second stencil mask 6 are increased due to the deformation of the second stencil mask 6, and the impurity ions 10 thus increased are blocked by the first stencil mask 2, which deteriorates the first stencil mask 2. However, since most of the impurity ions 10 applied to the second stencil mask 6 are blocked by the second stencil mask 6, then the deterioration speed of the first stencil mask 2 can be lowered.

Second Embodiment

Figure 4:
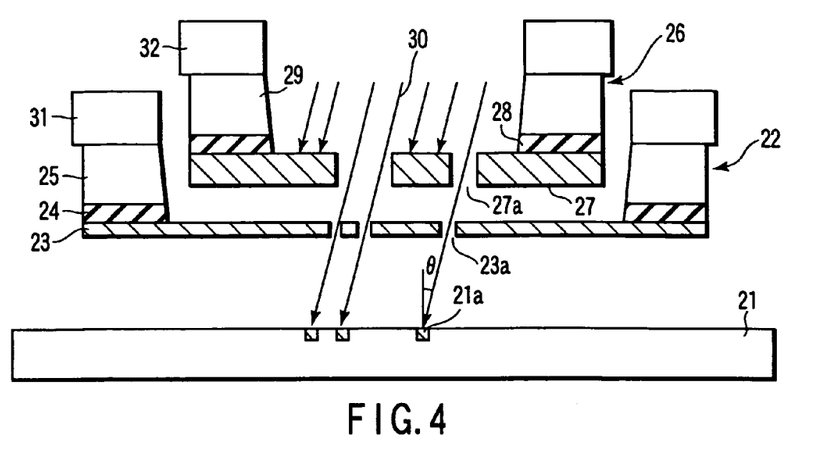
FIG. 4 is a cross sectional view of a part of an ion implantation device of a semiconductor device manufacturing apparatus according to a second embodiment of the present invention.

FIG. 4 shows a positional relation between stencil masks 22, 26 and a semiconductor substrate 21 of a semiconductor device manufacturing apparatus according to a second embodiment of the present invention.

In the present embodiment, corresponding parts as those in the first embodiment are identified with corresponding reference numerals, and the explanation thereof is omitted.

The first stencil mask 22 is set above the semiconductor substrate 21 at a distance from the semiconductor substrate 21. Also, the second stencil mask 26 is set above the first stencil mask 22 at a distance from the first stencil mask 22.

The first and second stencil masks 22, 26 have first and second thin silicon films 23, 27, respectively. The first and second thin silicon films 23, 27 have first and second openings 23a, 27a formed therein, respectively, for allowing impurity ions 30 to pass therethrough. Also, the first and second stencil masks 22, 26 have first and second support portions 25, 29 made of silicon. The first and second support portions 25, 29 support the first and second thin silicon films 23, 27, respectively. A first silicon oxide film (insulating film) 24 is formed between the first thin silicon film 23 and the first support portion 25. A second silicon oxide film (insulating film) 28 is formed between the second thin silicon film 27 and the second support portion 29.

The film thickness of the first thin silicon film 23 is smaller than the film thickness of the second thin silicon film 27. The first and second openings 23a, 27a formed in the first and second thin silicon films 23, 27, respectively, have a different pattern.

Generally, processing of an opening depends on the aspect ratio. Thus, the thinner the film is, the more finely the opening can be processed. A second opening 27a has a large size pattern, and a first opening 23a has a small size pattern.

Like the first embodiment, electrostatic chucks 31, 32 chuck the first and second support portions 25, 29, respectively, to fix the first and second stencil masks 22, 26, respectively, at predetermined portions of the ion implanting device. The first and second stencil masks 22, 26 are relatively moved by, for example, an XYZθ stage (not shown), in accordance with the incident angle θ of the impurity ions, to adjust the positional relation between the first and second openings 23a and 27a of the first and second stencil masks 22, 26 and an impurity ion implantation region of the semiconductor substrate 21.

The relative positioning of the first stencil mask 22 and the second stencil mask 26 can be checked by using, for example, an optical device (not shown) in a manner similar to the first embodiment. That is, to this end, an alignment opening (not shown) is formed in the second stencil mask 26, and an alignment pattern (not shown) is formed on the first stencil mask 22. The alignment pattern of the first stencil mask 22 is monitored in the θ direction using the optical device through the alignment opening of the second stencil mask 26 from above the second stencil mask 26, while the first stencil mask 22 and second stencil mask 26 are relatively moved by the XYZθ stage.

Similarly, the relative positioning of the first and second stencil masks 22, 26 and the semiconductor substrate 21 can be checked by using the optical device in a manner similar to the first embodiment. That is, to this end, first and second alignment openings (not shown) are formed in the first and second stencil masks 22, 26, and an alignment pattern (not shown) is formed in the semiconductor substrate 21. The alignment pattern of the semiconductor substrate 21 is monitored in the θ direction using the optical device through the second alignment opening and first alignment opening from above the second stencil mask 26, while the first stencil mask 22 and second stencil mask 26 are relatively moved by the XYZθ stage.

A relative positional relation between the first stencil mask 22 and the second stencil mask 26 is such that the second stencil mask 26 is positioned so as to expose all of the first openings 23a of the first stencil mask 22 when the first openings 23a of the first stencil mask 22 are monitored in the θ direction through the second openings 27a of the second stencil mask 26.

Since the second stencil mask 26 is thick, when the impurity ions 30 with incident angle θ enter the second opening 27a of the second stencil mask 26, then most of the impurity ions 30 impinge upon the side wall of the second opening 27a due to shadowing, thus the pattern of the impurity ions 30 having passed through the second opening 27a of the second stencil mask 26 is decreased. However, since the second opening 27a of the second stencil mask 26 has a large size pattern, the pattern of the impurity ions 30 having passed through the second opening 27a of the second stencil mask 26 is still larger than the size of the impurity ion implantation region 21a of the semiconductor substrate 21. The second stencil mask 26 is thick and it is rigid. Thus, the second stencil mask 26 is hardly deteriorated even by the blocking of the impurity ions or the like.

On the other hand, the first stencil mask 22 is thin, and it is weak to impurity ions being impinged thereon. However, only those of the impurity ions 30 having passed through the second opening 27a of the second stencil mask 26 reach the first stencil mask 22. Thus, the first stencil mask 22 receives not so large damage, and it is prevented from being destroyed. Furthermore, since the first stencil mask 22 is thin, the influence by shadowing is small. Thus, those of the impurity ions 30 having entered the first openings 23a of the first stencil mask 22 passes therethrough and are implanted into the impurity ion implantation region 21a of the semiconductor substrate 21.

Since the second opening 27a is of large size, then the second opening 27a cannot define the impurity ion implantation region 21a of the semiconductor substrate 21. However, the second opening 27a reduces the amount of the impurity ions 30 to be blocked by the thin first stencil mask 22, so that the deterioration speed of the first stencil mask 22 can be lowered.

Third Embodiment

Figure 5:
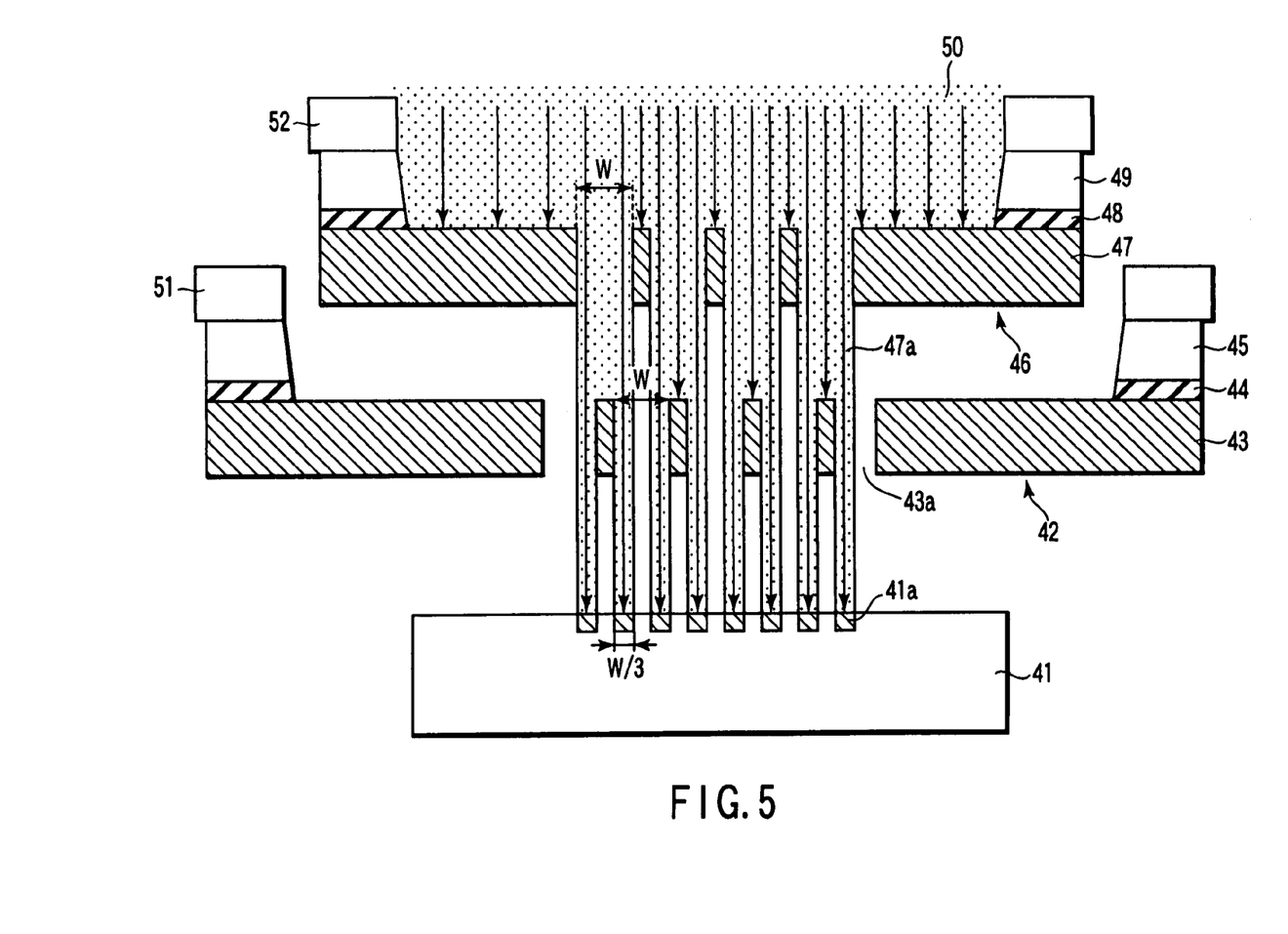
FIG. 5 is a cross sectional view of a part of an ion implantation device of a semiconductor device manufacturing apparatus according to a third embodiment of the present invention.

FIG. 5 shows a positional relation between stencil masks 42, 46 and a semiconductor substrate 41 of a semiconductor device manufacturing apparatus according to a third embodiment of the present invention.

In the present embodiment, corresponding parts as those in the first embodiment are identified with corresponding reference numerals, and the explanation thereof is omitted.

The first stencil mask 42 is set above the semiconductor substrate 41 at a distance from the semiconductor substrate 41. Also, the second stencil mask 46 is set above the first stencil mask 42 at a distance from the first stencil mask 42.

The first and second stencil masks 42, 46 have first and second thin silicon films 43, 47, respectively. The first and second thin silicon films 43, 47 have first and second openings 43a, 47a formed therein, respectively, for allowing impurity ions 50 to pass therethrough. Also, the first and second stencil masks 42, 46 have first and second support portions 45, 49 made of silicon. The first and second support portions 45, 49 support the first and second thin silicon films 43, 47, respectively. A first silicon oxide film (insulating film) 44 is formed between the first thin silicon film 43 and the first support portion 45. A second silicon oxide film (insulating film) 48 is formed between the second thin silicon film 47 and the second support portion 49.

Generally, processing of the openings of the first and second stencil masks 42, 46 depends on the aspect ratio. Thus, the thinner the film is, the more finely the opening can be processed.

Like the first embodiment, electrostatic chucks 51, 52 chuck the first and second support portions 45, 49, respectively, to fix the first and second stencil masks 42, 46, respectively, at predetermined portions of the ion implanting device. The first and second stencil masks 42, 46 are relatively moved by, for example, an XYZθ stage (not shown), in accordance with an incident angle of the impurity ions, to adjust the positional relation between the first and second openings 43a and 47a of the first and second stencil masks 42, 46 and an impurity ion implantation region of the semiconductor substrate 41.

The relative positioning of the first stencil mask 42 and the second stencil mask 46 can be checked by using, for example, an optical device (not shown) in a manner similar to the first embodiment. That is, to this end, an alignment opening (not shown) is formed in the second stencil mask 46, and an alignment pattern (not shown) is formed on the first stencil mask 42. The alignment pattern of the first stencil mask 42 is monitored in the implantation direction (θ direction) using the optical device through the alignment opening of the second stencil mask 46 from above the second stencil mask 46, while the first stencil mask 42 and second stencil mask 46 are relatively moved by the XYZθ stage.

Similarly, the relative positioning of the first and second stencil masks 42, 46 and the semiconductor substrate 41 can be checked by using the optical device in a manner similar to the first embodiment. That is, to this end, first and second alignment openings (not shown) are formed in the first and second stencil masks 42, 46, and an alignment pattern (not shown) is formed in the semiconductor substrate 41. The alignment pattern of the semiconductor substrate 41 is monitored in the implantation direction (θ direction) using the optical device through the second alignment opening and first alignment opening from above the second stencil mask 46, while the first stencil mask 42 and second stencil mask 46 are relatively moved by the XYZθ stage.

A relative positional relation between the first stencil mask 42 and the second stencil mask 46 is such that the first and second stencil masks 42 and 46 are positioned so as to align in the implantation direction (implantation direction of the impurity ions 50) the first and second openings 43a, 47a of the first and second stencil mask 42, 46 with the impurity ion implantation region 41a of the semiconductor substrate 41.

The first opening 43a of the first stencil mask 42 alone does not define the impurity ion implantation region 41a of the semiconductor substrate 41. The second opening 47a of the second stencil mask 46 alone does not define the impurity ion implantation region 41a of the semiconductor substrate 41, either.

In a state in which the first and second stencil masks 42, 46 are relatively positioned, the ions 50 having passed through the overlapped portion of the both openings of the first opening 43a and second opening 47a define the impurity ion implantation region 41a of the semiconductor substrate 41.

The ions 50 having passed through the opening of a width W of the second opening 47a reach the first stencil mask 42. Although the width of the first opening 43a is W, not all ions 50 of width W having passed through the second opening 47a pass through the first opening 43a, since the first opening 43a is shifted from the second opening 47a. Part of the ions 50 of width W having passed through the second opening 47a are blocked by the first stencil mask 42, and ions 50 of width W/3 are passed through the first stencil mask 42. The ions 50 of width W/3 reach the semiconductor substrate 41, thus forming the impurity ion implantation region 41a of width W/3.

In this way, the impurity ion implantation region 41a of the semiconductor substrate 41 can have a fine pattern by arranging the two stencil masks in a shift manner, as shown in FIG. 5. In other words, a fine pattern implantation region which is impossible to realize using a single stencil mask can be obtained by arranging the two stencil masks in the shift manner.

The film thickness of the thin silicon films of the stencil masks is not required to be thin, and hence deterioration of the stencil masks is lowered.

In this embodiment, the width of the impurity ion implantation region is ⅓ of the opening width W of the second stencil mask 46. However, the ratio of the opening width of the stencil masks and the ion implantation region width is not limited to this ratio. At least one implantation region smaller than the opening widths of the openings of the two stencil masks is defined by ions having passed through the openings of the two stencil masks.

Also in the embodiment, the incident angle of implantation of particles into the semiconductor substrate is not particularly specified, and it may be vertical to the semiconductor substrate or at an angle of θ (θ>0) from the vertical direction to the semiconductor substrate.

Fourth Embodiment

Figure 6:
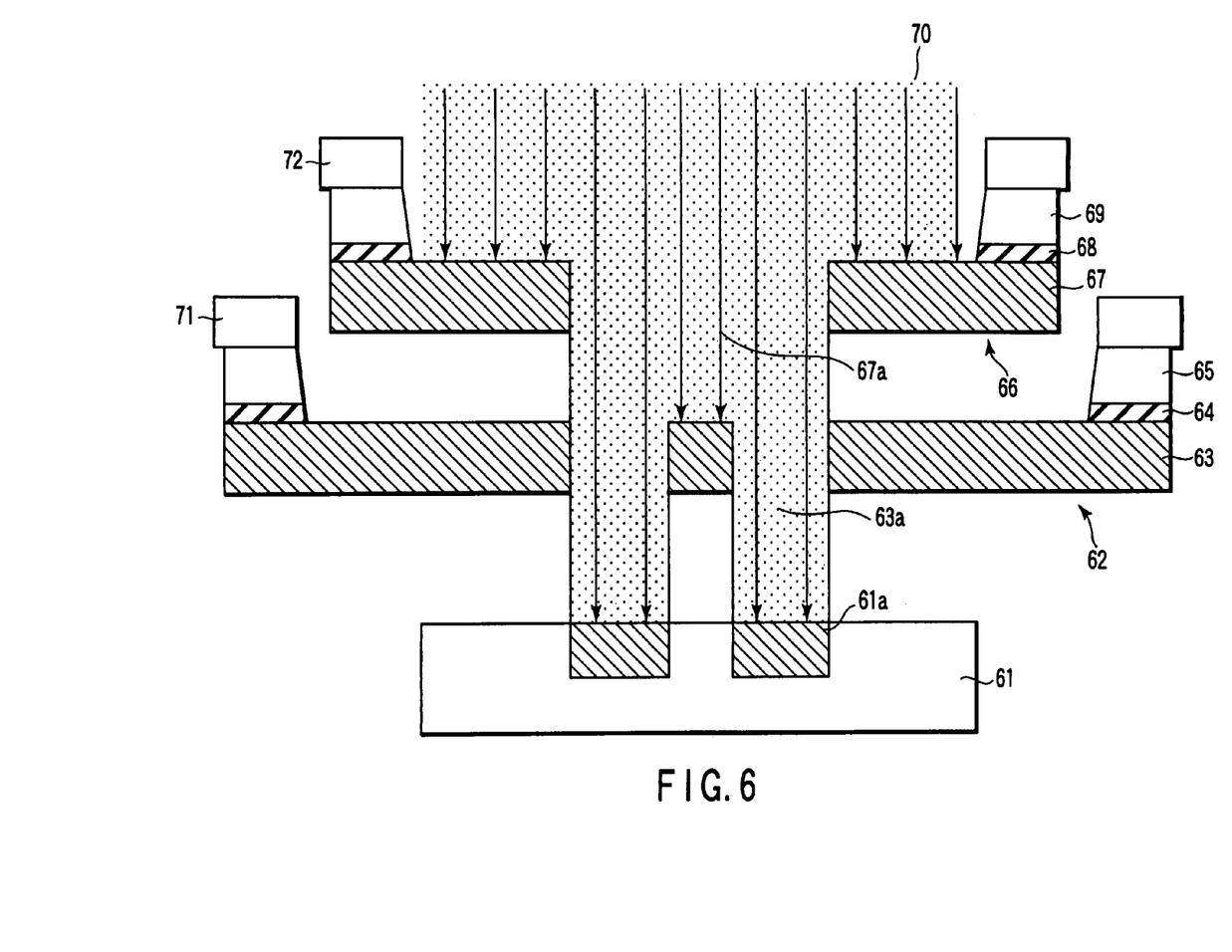
FIG. 6 is a cross sectional view of a part of an ion implantation device of a semiconductor device manufacturing apparatus according to a fourth embodiment of the present invention.

FIG. 6 shows a positional relation between stencil masks 62, 66 and a semiconductor substrate 61 of a semiconductor device manufacturing apparatus according to a fourth embodiment of the present invention.

In the present embodiment, corresponding parts as those in the first embodiment are identified with corresponding reference numerals, and the explanation thereof is omitted.

The first stencil mask 62 is set above the semiconductor substrate 61 at a distance from the semiconductor substrate 61. Also, the second stencil mask 66 is set above the first stencil mask 62 at a distance from the first stencil mask 62.

The first and second stencil masks 62, 66 have first and second thin silicon films 63, 67, respectively. The first and second thin silicon films 63, 67 have first and second openings 63a, 67a formed therein, respectively, for allowing impurity ions 70 to pass therethrough. Also, the first and second stencil masks 62, 66 have first and second support portions 65, 69 made of silicon. The first and second support portions 65, 69 support the first and second thin silicon films 63, 67, respectively. A first silicon oxide film (insulating film) 64 is formed between the first thin silicon film 63 and the first support portion 65. A second silicon oxide film (insulating film) 68 is formed between the second thin silicon film 67 and the second support portion 69.

Figure 7:
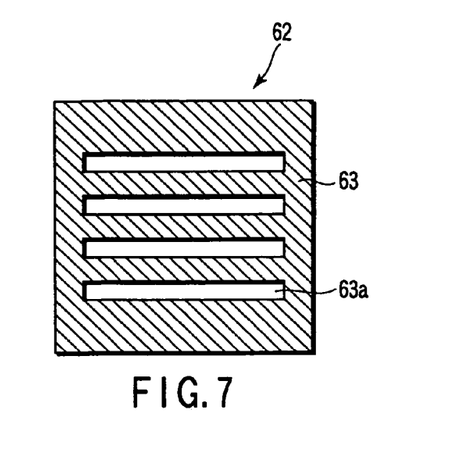
FIG. 7 is a plan view of an example of a stencil mask used in the ion implantation device of the semiconductor device manufacturing apparatus according to the fourth embodiment of the present invention.
Figure 8:
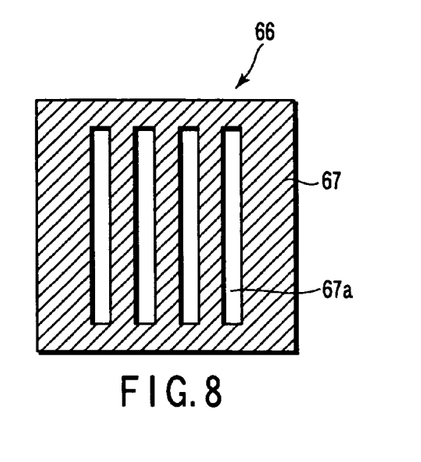
FIG. 8 is a plan view of another example of the stencil mask used in the ion implantation device of the semiconductor device manufacturing apparatus according to the fourth embodiment of the present invention.
Figure 9:
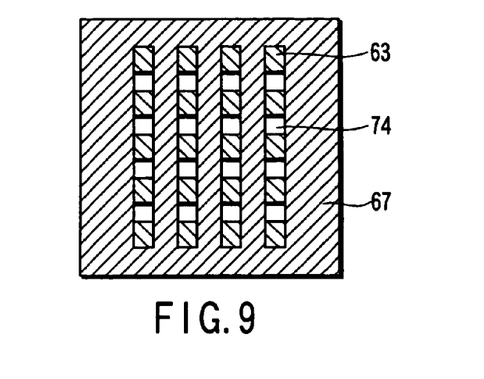
FIG. 9 is a plan view of a stencil mask obtained by overlapping the stencil masks shown in FIGS. 7 and 8 used in the ion implantation device of the semiconductor device manufacturing apparatus according to the fourth embodiment of the present invention.

FIG. 7 is a plan view of the first stencil mask 62, FIG. 8 is a plan view of the second stencil mask 66, and FIG. 9 is a plan view of overlaid first and second stencil masks 62, 66.

The first stencil mask 62 has a first opening 63a that is rectangular and longer in the lateral direction, as shown in FIG. 7. The second stencil mask 66 has a second opening 67a that is rectangular and longer in the longitudinal direction, as shown in FIG. 8. When the first stencil mask 62 and second stencil mask 66 are overlapped at a predetermined distance, as shown in FIG. 9, a third opening 74 of square shape is provided.

As shown in FIG. 9, when ions 70 are implanted in the semiconductor substrate 61 from above the overlapped stencil masks of the first and second stencil masks 62, 66 as shown in FIG. 7, an implantation region 61a of the square opening 74 is formed.

Generally, in a case of carrying out an anisotropic etching for forming an opening in a stencil mask, as compared with a nearly square shape, if the width is the same, an elongated opening is easily formed since the opening area is large.

The radius of curvature of a corner of a square pattern cannot be reduced to a certain limit or less. According to the present embodiment, an implantation region of the semiconductor substrate of a square pattern with high precision can be easily provided.

In the foregoing embodiments, the number of stencil masks overlapped is not limited to two, but three or more may be overlapped. By overlaying more stencil masks, an implantation region of the semiconductor substrate of fine pattern can be formed. It is also possible to lower the deterioration speed of the stencil mask that directly faces the semiconductor substrate and ultimately defines the pattern of the implantation region of the semiconductor substrate.

Instead of positioning the first stencil mask and second stencil mask individually by a positioning device such as XYZθ stage, the first stencil mask and second stencil mask may be preliminarily fixed at a predetermined distance, and may be used as one stencil mask.

As described herein, according to the embodiments of the invention, the deterioration speed of the stencil masks is lowered, the effects of shadowing is reduced, and a fine implantation region of the semiconductor substrate is provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

generating particles to be implanted into a semiconductor substrate;

causing the particles to pass through a first opening of a first stencil mask having the first opening formed therein, the first opening having a first pattern;

causing the particles having passed through the first opening to pass a second opening of a second stencil mask having the second opening formed therein, the second opening having a second pattern, and the first pattern and the second pattern creating in combination a circuit pattern to be formed on an implantation region of the semiconductor substrate, the first and second stencil being positioned so that they may be used as one stencil mask; and applying the particles having passed through the second opening of the second stencil mask to the implantation region of the semiconductor substrate to form the circuit pattern on the implantation region of the semiconductor substrate.

2. A method of manufacturing a semiconductor device, according to claim 1, wherein the particles are implanted into the implantation region of the semiconductor substrate in a θ direction (θ≧0) shifted by an angle θ from a vertical direction of the implantation region of the semiconductor substrate.

3. A method of manufacturing a semiconductor device, according to claim 1, wherein the implantation region of the semiconductor substrate is smaller than the first opening of the first stencil and the second opening of the second stencil.

4. A method of manufacturing a semiconductor device, comprising:

generating particles to be implanted into a semiconductor substrate;

causing the particles to pass through a first opening of a first stencil mask having the first opening formed therein, the first opening having a first pattern;

causing the particles having passed through the first opening to pass a second opening of a second stencil mask having the second opening formed therein, the second opening having a second pattern, and the first pattern and the second pattern creating in combination a circuit pattern to be formed on an implantation region of the semiconductor substrate, the first and second stencil being positioned so that they may be used as one stencil mask; and applying the particles having passed through the second opening of the second stencil mask to the implantation region of the semiconductor substrate to form the circuit pattern on the implantation region of the semiconductor substrate;

wherein the first opening of the first stencil has a rectangle shape having a first width in a first direction, and the second opening of the second stencil has a rectangle shape having a second width in a second direction orthogonal to the first direction, and the implantation region has a square having one side of a length corresponding to the first width of the rectangle shape of the first opening and another side of a length adjacent to the first side corresponding to the second width of the rectangle shape of the second opening.

* * * * *

UNITED STATES PATENT AND TRADEMARK OFFICE
CERTIFICATE OF CORRECTION

PATENT NO. : 7,282,725 B2
APPLICATION NO. : 11/284035
DATED : October 16, 2007
INVENTOR(S) : Shibata et al.

It is certified that error appears in the above-identified patent and that said Letters Patent is hereby corrected as shown below:

Claim 1, column 13, line 11, change "stencil being" to --stencil masks being--.

Claim 4, column 14, line 12, change "stencil being" to --stencil masks being--.

Signed and Sealed this

Eighteenth Day of March, 2008

JON W. DUDAS
*Director of the United States Patent and Trademark Office*